US007977762B1

(12) United States Patent  
Keramat et al.

(10) Patent No.: US 7,977,762 B1
(45) Date of Patent: Jul. 12, 2011

(54) EFFECTIVE SHIELD STRUCTURE FOR IMPROVING SUBSTRATE ISOLATION OF ANALOG CIRCUITS FROM NOISY DIGITAL CIRCUITS ON A SYSTEM-ON-CHIP (SOC)

(75) Inventors: Mansour Keramat, San Jose, CA (US); Mehrdad Heshami, Stanford, CA (US); Syed S. Islam, Cupertino, CA (US)

(73) Assignee: Alvand Technologies, Inc., Santa Clara, CA (US)

( * ) Notice: Subject to any disclaimer, the term of this patent is extended or adjusted under 35 U.S.C. 154(b) by 239 days.

(21) Appl. No.: 12/331,386

(22) Filed: Dec. 9, 2008

(51) Int. Cl.  
*H01L 29/06* (2006.01)

(52) U.S. Cl. ........ 257/494; 257/202; 257/203; 257/509; 257/490; 257/495; 257/499; 257/544; 257/E27.11; 257/E29.012; 257/E29.013; 257/E29.019; 257/E21.544

(58) Field of Classification Search .................. None  
See application file for complete search history.

(56) References Cited

U.S. PATENT DOCUMENTS

| 6,157,073 A * | 12/2000 | Lehongres ............ 257/500 |
| 2004/0075144 A1* | 4/2004 | Zitouni et al. ........ 257/355 |
| 2007/0188369 A1* | 8/2007 | Itagaki ................. 341/156 |

* cited by examiner

*Primary Examiner* — Minh-Loan T Tran  
*Assistant Examiner* — Fei Fei Yeung Lopez  
(74) *Attorney, Agent, or Firm* — Maryam Imam; IPxLaw Group LLP

(57) ABSTRACT

An integrated circuit (IC) is disclosed to include a central area of the IC that is partitioned into a first section containing at least one digital circuit and a second section containing at least one analog circuit; and a guard strip (or shield) that is within the central area and that is positioned within between the digital circuit and the analog circuit. The shield or guard strip comprises of n-well and p-tap regions that separate digital and analog circuits.

5 Claims, 5 Drawing Sheets

US 7,977,762 B1

EFFECTIVE SHIELD STRUCTURE FOR IMPROVING SUBSTRATE ISOLATION OF ANALOG CIRCUITS FROM NOISY DIGITAL CIRCUITS ON A SYSTEM-ON-CHIP (SOC)

CROSS REFERENCE TO RELATED APPLICATIONS

This application relates to U.S. patent application Ser. No. 12/331,373 filed on Dec. 9, 2008, entitled "A SEAL RING FOR REDUCING NOISE COUPLING WITHIN a SYSTEM-ON-CHIP (SoC)", by Mansour Keramat, Syed Islam, and Mehrdad Heshami, which is hereby incorporated by reference in its entirety.

FIELD OF THE INVENTION

The present invention relates generally to integrated circuit (IC) design and manufacturing, and more specifically to the design and manufacturing of guard strips.

BACKGROUND OF THE INVENTION

A single modern semiconductor integrated circuit (IC), commonly referred to as a chip, often contains both one or more analog circuit blocks and one or more digital circuit blocks. Combining analog circuits and digital circuits within the same IC is commonly called a system on a chip (SoC). An IC that implements an SoC provides significant advantages for the electronic device that includes such a chip. These advantages include: increased speed and reduced power, because more of the electronic device's signals stay within the SoC IC. These advantages also include reduced cost and reduced space requirements, because more of the electronic device is implemented within fewer SoC ICs.

However, implementing both an analog circuit and a digital circuit within the same IC poses very substantial design challenges. One of the foremost among these challenges is that electronic noise generated in the digital circuit generally transfers over to the analog circuit. Such electronic noise can easily interfere with the proper operation of the analog circuit. Such a noise transfer is also known as a coupling or an injection.

A digital circuit generally operates based on large swings in the voltages of its signal wires and clock wires. These large swings can produce substantial electrical noise in the power supply lines (i.e., $V_{dd}$ lines), in the signal ground lines (i.e., $V_{ss}$ lines), and in the substrate of the IC (i.e., the package ground).

Digital circuits are generally more immune to electrical noise than are analog circuits. Thus, such noise is not usually enough to disrupt the operation of other digital circuits even if they are nearby. In contrast, analog circuits often operate with signals where relatively small voltage swings can be of crucial significance. Thus such noise may be enough to disrupt the proper functioning of an analog circuit even if a substantial distance separates the location of the analog circuit from the location of the digital circuit.

A SoC IC may provide a digital $V_{dd}$ and a digital $V_{ss}$ that are respectively kept separate from an analog $V_{dd}$ and an analog $V_{ss}$. However, a single IC must be implemented using a single substrate which is electrically not an insulator.

Thus, there is a need for a system that reduces transfer of electronic noise from a digital circuit to an analog circuit within the same IC, where the transfer is via the substrate. There is also a need for a method of manufacturing such a system.

SUMMARY OF THE INVENTION

To overcome the limitations described above, and to overcome other limitations that will become apparent upon reading and understanding this specification, the present invention includes an integrated circuit (IC) having a guard strip (also referred to as shield).

The IC includes: 1) a central area of the IC that is partitioned into a first section containing at least one digital circuit and a second section containing at least one analog circuit; and 2) a guard strip that is within the central area and that is positioned between the digital circuit and the analog circuit.

In some embodiments, the guard strip includes one or more shield sections. Each shield section includes an n-type well and a p-tap region which is connected to ground. The position, within the particular shield section, of the n-type well is closer to the digital circuit than is the p-tap.

In other embodiments, the guard strip includes N shield sections, with N being two or more. The shield section that is closest to the digital circuit has the widest n-type well while the n-type well closest to the analog circuit is the narrowest. The width of the n-type wells in the intermediate shield sections is monotonically reduced as one move from the digital end of the shield to the analog end.

In yet other embodiments, the guard strip includes N shield sections, with N being two or more. The p-tap in the shield section that is closest to the analog circuit is wider than the p-tap in the shield section that is next closest to the analog circuit, which in turn has a p-tap that is wider than the p-tap in the shield section that is next closest to the analog circuit, and so on.

These and other aspects of the present invention will become apparent to those skilled in the art after having read the figures and the following detailed description.

IN THE DRAWINGS

DETAILED DESCRIPTION

In the following description of the embodiments, reference is made to the accompanying drawings that form a part hereof, and in which is shown by way of illustration of the specific embodiments in which the invention may be practiced. It is to be understood that other embodiments may be utilized because structural, functional, usage, and other changes may be made without departing from the scope of the present invention.

Figure 1:
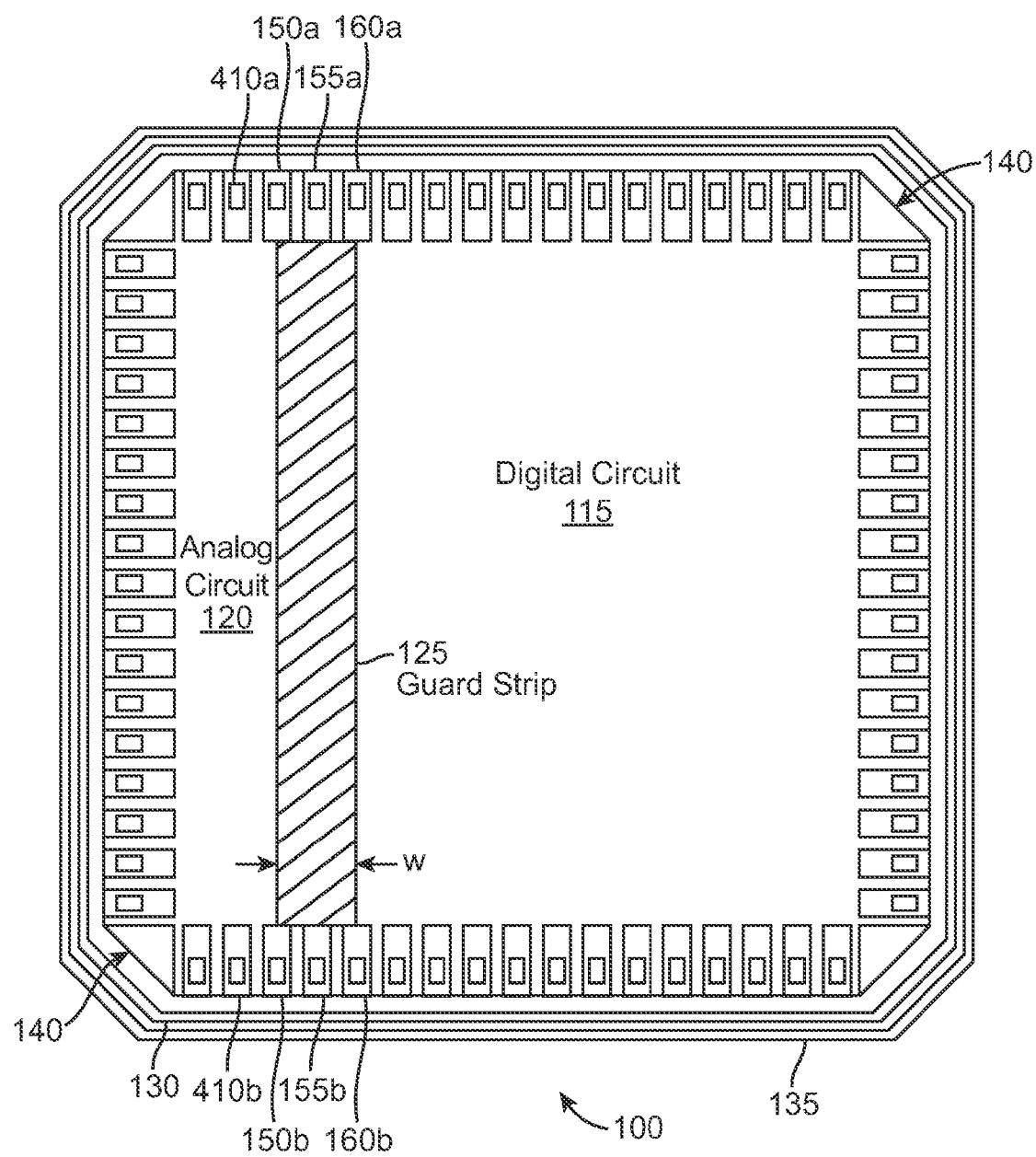
FIG. 1 shows a top view of an integrated circuit (IC) according to an embodiment of the present invention.

FIG. 1 shows a top view of the integrated circuit (IC) 100 according to an embodiment of the present invention. The IC 100 is shown to include: the central area 140; the inner seal ring 130, and optionally the outer seal ring 135. The inner seal ring 130 surrounds the central area 140. When used, the outer seal ring 135 surrounds the inner seal ring. The inner seal ring 130, the outer seal ring 135, or both, may contain gaps, as described in U.S. patent application Ser. No. 12/331,373, filed on Dec. 9, 2008, entitled "A SEAL RING FOR REDUCING NOISE COUPLING WITHIN a SYSTEM-ON-CHIP (SoC)", by Mansour Keramat, Syed Islam, and Mehrdad Heshami, which is hereby incorporated by reference in its entirety.

In some embodiments, more than one guard strip may be employed.

The inner seal ring 130 is shown to extend around the outside periphery of the central area 140. The outer seal ring 135 is shown position outside of the inner seal ring 130 toward the outer periphery of the IC 100 and farther away from the inner seal ring 130 relative to the central area 140.

The central area 140 is shown to include: the analog circuit 120, the digital circuit 115, the guard strip 125, and pads. The guard strip 125 is positioned between and separates the analog circuit 120 from the digital circuit 115. In one embodiment of the present invention, the guard strip 125 extends between two opposite sides of the central area 140. The guard strip 125 has width W. The guard strip 125 includes 3 shield sections, as described in reference to FIGS. 2 and 3. It is noted that in other embodiments, higher number of shield sections may be employed if better isolation is required.

As used herein, "circuit" refers to one or more circuits that may function independently or in conjunction with each other. In some embodiments, the analog circuit includes a radio frequency (RF) circuit, an analog base band circuit, or any combination of both. In some embodiments, the digital circuit includes any combination of: a digital signal processing (DSP) circuit, a base band processing (BBP) circuit, or other types of digital circuits.

The pads, which are shown disposed on all sides of the central area 140, and within the inner seal ring 130 thereby forming the outer walls of the central area 140, are shown to include the $V_{ss}$ pads 150a, 150b, 155a, 155b, 160a, and 160b. "Vss", as used herein, refers to analog ground or lower analog power supply voltage. $V_{ss}$ is referred as ground in the description. "Vdd", as used herein, refers to higher analog power supply voltage. $V_{ss}$ pads 160a and 160b ground both ends of the p-tap strip within the first shield section within the guard strip 125. $V_{ss}$ pads 155a and 155b ground both ends of the p-tap strip within the second shield section within the guard strip 125. $V_{ss}$ pads 150a and 150b ground both ends of the p-tap strip within the third shield section within the guard strip 125. $V_{ss}$ pads 150a, 150b, 155a, 155b, 160a, and 160b are tied to the chip ground at package level, each through separate bonding wires.

Figure 2:
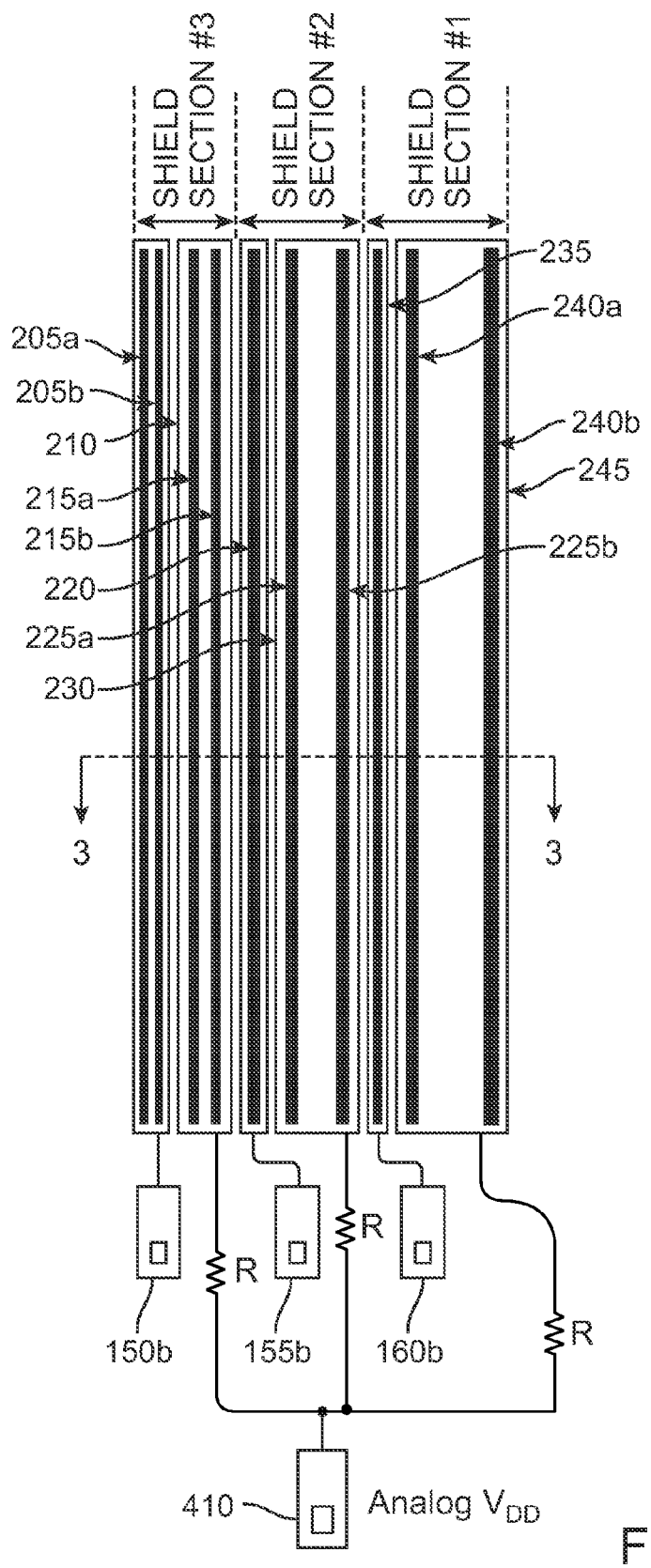
FIG. 2 shows a top view of a guard strip according to an embodiment of the present invention.

FIG. 2 shows a top view of the guard strip 125 according to an embodiment of the present invention. The guard strip 125 includes 3 shield sections: the shield section number 1 (which is closest to the digital circuit 115); the shield section number 2 (which is situated in between sections 1 and 3); and the shield section number 3 (which is closest to the analog circuit 120). Each shield section includes both an n-type well and a row of p-taps. The position, within each shield section, of the n-type well is closer to the digital circuit than is the p-tap.

Figure 4:
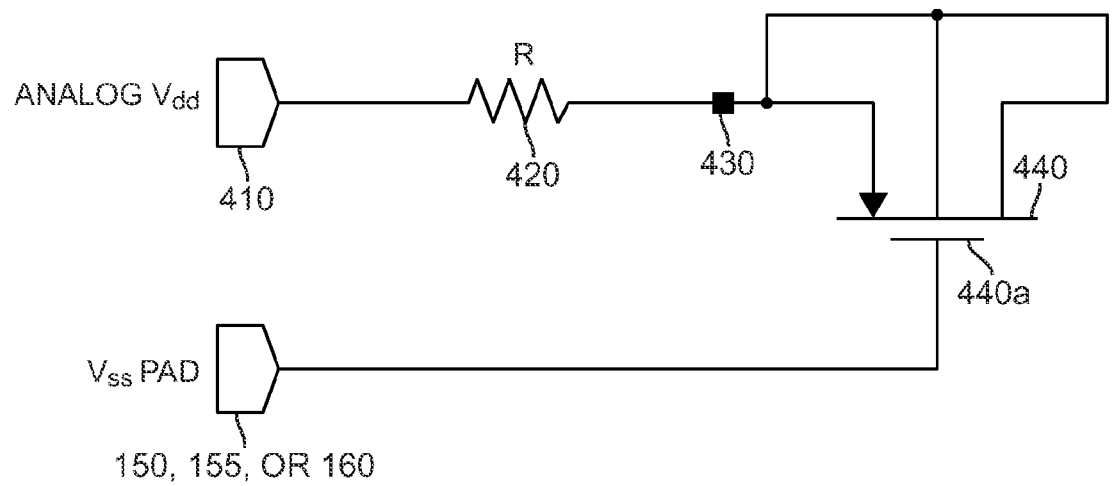
FIG. 4 shows a circuit diagram for a section of a guard strip according to an embodiment of the present invention.

The shield section number 1, includes the p-tap strip 235, the n-tap strips 240a and 240b, and the n-type well 245. The n-tap strips 240a and 240b are positioned within, and along each side, of the n-type well 245. Each end of the p-tap strip 235 is connected to one of $V_{ss}$ pads 160a and 160b. For clarity the pad 160a is not shown in FIG. 2, but it is shown in FIG. 1. The n-tap strips 240a and 240b are coupled to Vdd pad through a resistor. In another embodiment of the present invention, the n-well region can be implemented by PMOS with source and drain tied to the body as shown in FIG. 4. The gate of the PMOS is coupled to Vss pads 160a and 160b.

Vss pads are connected to respective p-tap strips. N-well segments of each shield section are as shown in FIG. 4. Vss pads are also coupled to the gate of each PMOS. N-well (body) of each PMOS as well as source and drain are coupled to Vdd pads through a on-chip resistor R.

The shield section number 2, includes the p-tap strip 220, the n-tap strips 225a and 225b, and the n-type strip 230. The n-tap strips 225a and 225b are positioned within, and along each side, of the n-type strip 230. The n-type strip 230 is narrower than the n-type strip 245 (of shield section number 1). The p-tap strip 220 is wider than the p-tap strip 235 (of shield section number 1). Each end of the N-type strip 230 is connected to $V_{dd}$ pads through R. For clarity the pad 155a is not shown in FIG. 2, but it is shown in FIG. 1.

The shield section number 3, includes the p-tap strip 205a and 205b, the n-tap strips 215a and 215b, and the n-type strip 210. The n-tap strips 215a and 215b are positioned within, and along each side, of the n-type strip 210. The n-type strip 210 is narrower than the n-type strip 230 (of shield section number 2). The p-tap strip 205a and 205b form a p-tap region that is wider than the p-tap strip 220 (of shield section number 2). Each end of the N-type strip 210 is connected to one of the $V_{dd}$ pads through R. For clarity the pad 150a is not shown in FIG. 2, but it is shown in FIG. 1.

Figure 3:
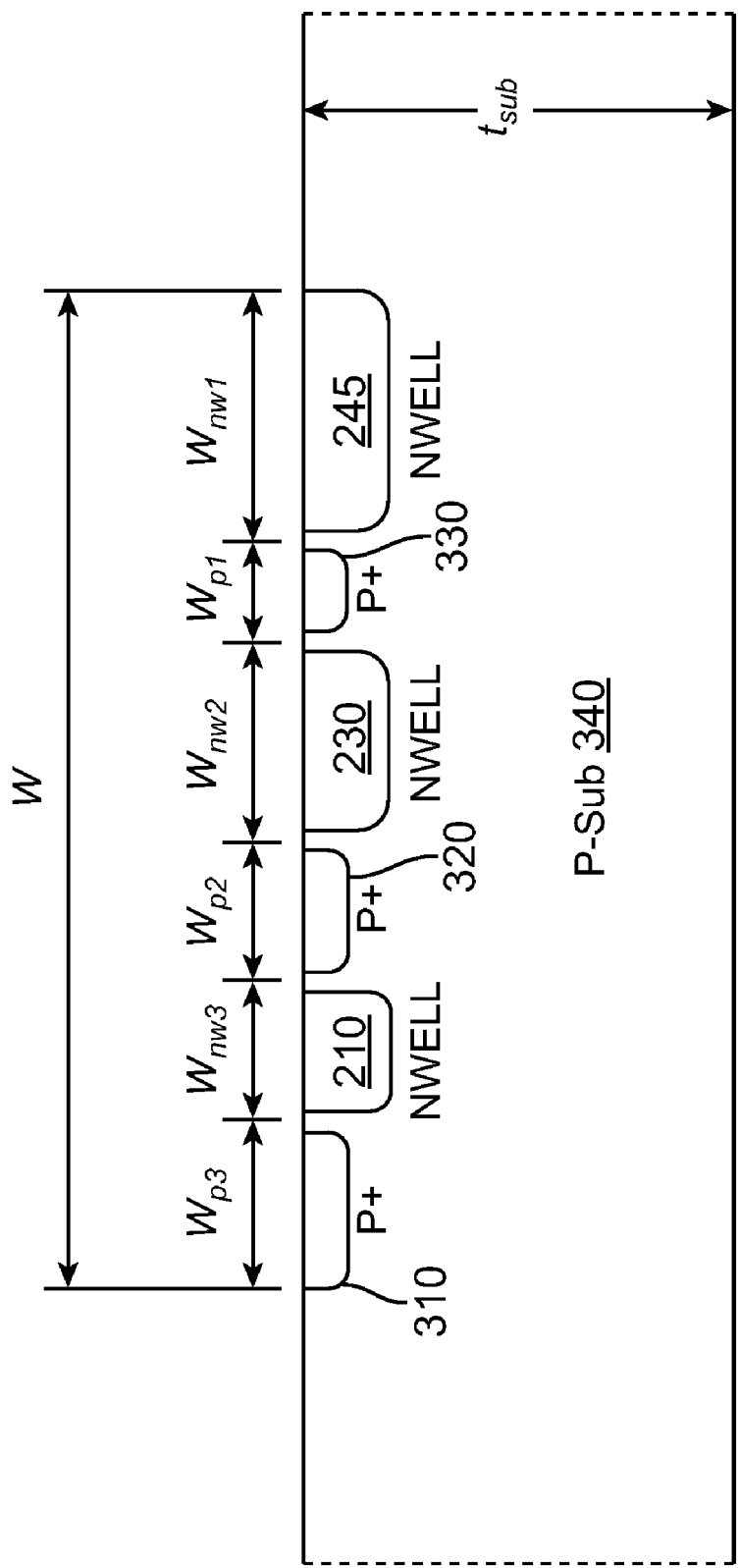
FIG. 3 shows a cut away side view of a guard strip according to an embodiment of the present invention.

FIG. 3 shows a cut away side view of the guard strip 125 according to an embodiment of the present invention. In this view, the portion of the IC above cut line 3 is removed. Cut line 3-3 is shown in FIG. 2. The guard strip 125 includes the p+ regions 310, 320, and 330, which are used to form the p-taps, and the n-type wells 210, 230, and 245.

The n-type well 245 is closest to the digital circuit 115 (as shown in FIG. 1). The n-type well 245 requires a total width of $W_{nw1}$, including half of the separation between the n-type well 245 and the p+ region 330. The p+ region 330 is next closest to the digital circuit 115. The p+ region 330 requires a total width of $W_{p1}$, including half of the separations between the p+ region 330 and the n-type wells 230 and 245. The n-type well 245 and the p+ region 330 form the shield section number 1.

The n-type well 230 is next closest to the digital circuit 115. The n-type well 230 requires a total width of $W_{nw2}$, including half of the separations between the n-type well 230 and the p+ regions 320 and 330. The p+ region 320 is next closest to the digital circuit 115. The p+ region 320 requires a total width of $W_{p2}$, including half of the separations between the p+ region 330 and the n-type wells 230 and 210. The n-type well 230 and the p+ region 320 form the shield section number 2.

The n-type well 210 is next closest to the digital circuit 115. The n-type well 210 requires a total width of $W_{nw3}$, including half of the separations between the n-type well 210 and the p+ regions 310 and 320. The p+ region 310 is closest to the analog circuit 120 (as shown in FIG. 1). The p+ region 310 requires a total width of $W_{p3}$, including half of the separations between the p+ region 310 and the n-type well 210. The n-type well 210 and the p+ region 310 form the shield section number 3.

Example dimensions of the guard strip 125 are shown in Table 1.

TABLE 1

| Parameter | Width in μm |
|---|---|
| $W_{nw1}$ | 60 |
| $W_{nw2}$ | 45 |
| $W_{nw3}$ | 30 |
| $W_{p1}$ | 10 |

TABLE 1-continued

| Parameter | Width in μm |
|---|---|
| $W_{p2}$ | 15 |
| $W_{p3}$ | 20 |
| Total, W | 180 |

Substrate thickness $t_{sub}$ can be reduced to 125 μm using backlapping, which mechanically thins the backside of a finished semiconductor wafer.

The n-well regions of each shield section can be implemented by using PMOS. FIG. 4 shows a circuit diagram for a section of the guard strip according to an embodiment of the present invention.

In FIG. 4, the 'body' of a PMOS is used to design the n-well region of a shield section according to an embodiment of the present invention. In FIG. 4, each shield section includes a n-type well 440 and an n-tap 430. External to the shield section are resistor 420 and the $V_{ss}$ pads 150a and 150b, or 155a and 155b, or 160a and 160b. The resistor 420 is shown coupled to the body of the PMOS 430, which is shown coupled of the n-type well 440. The source/drain regions of the n-type well 440 are connected to the body of the PMOS 430 which in turn connected to the Vdd 410 the resistor 420. The resistance of the resistor 420 is R and in one embodiment of the present invention, R is on the order of 1kilo ohms (kΩ). As described later, the use of R reduces substrate noise coupling to Vdd. The n-type well 440 has a gate 440a is coupled to the assigned Vss of the section, i.e. Vss pads 150, 155 or 160. It should be noted that the use of PMOS helps maintain density requirements.

The n-type well 440 is shown here as a metal-oxide-semiconductor field-effect transistor (MOSFET). Resistor 420 is connected to the $V_{dd}$ power supply within the analog circuit 120 and to the n-type well 440 via n-tap 430. Each of the $V_{ss}$ pads 150a and 150b, or 155a and 155b, or 160a and 160b has its own bonding wire connecting the pad to a pin on the packaged IC, which is grounded at the circuit board level.

Each shield section includes the n-type well 440 and the n-tap 430. External to the shield section are resistor 420 and the $V_{ss}$ pads 150a and 150b, or 155a and 155b, or 160a and 160b.

The n-type well 440 is shown here as a metal-oxide-semiconductor field-effect transistor (MOSFET). Resistor 420 is connected to the $V_{dd}$ power supply within the analog circuit 120 and to the n-type well 440 via n-tap 430. Resistor 420 has resistance R, which can be on the order of 1 kΩ. Each of the $V_{ss}$ pads 150a and 150b, or 155a and 155b, or 160a and 160b has its own bonding wire connecting the pad to a pin on the packaged IC, which is grounded at the circuit board level.

Figure 5:
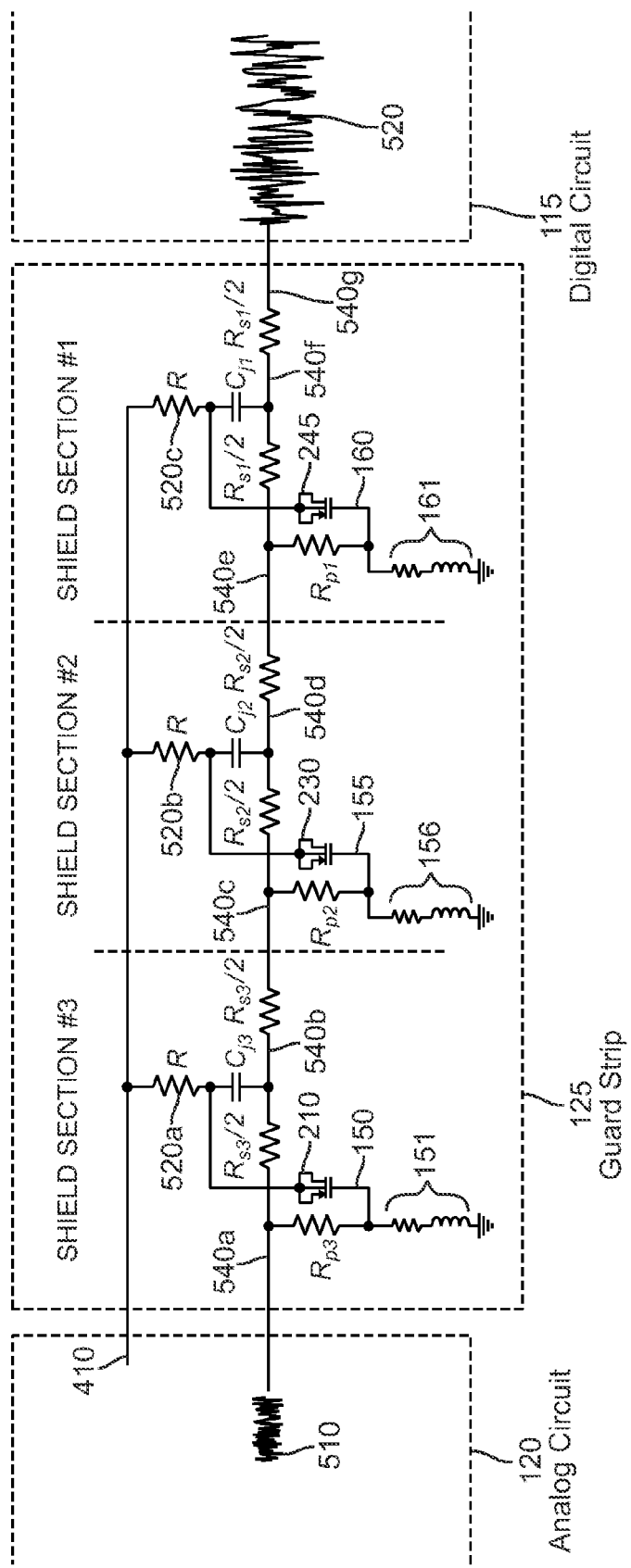
FIG. 5 shows a circuit diagram of an electrical model for a guard strip according to an embodiment of the present invention.

FIG. 5 shows a circuit diagram of an electrical model for the guard strip 125. That is, it shows the circuit elements and their interconnections of this electrical model. Waveform 520 represents the electrical noise on the substrate portion 540g, that is, the substrate within the digital circuit 115. Waveform 510, which is significantly smaller in amplitude than waveform 520, represents the electrical noise on the substrate portion 540a, that is, the substrate within the analog circuit 120.

The model for each shield section includes $V_{ss}$ pads 150a and 150b, or 155a and 155b, or 160a and 160b, as shown in FIG. 1. The model for each shield section also includes n-type wells 210, 230, or 245, as shown in FIGS. 2 and 3. The model for each shield section also includes analog $V_{dd}$ 410, as shown in FIG. 4. External series resistors 520a, 520b, and 520c are equivalent to resistor 420, as shown in FIG. 4.

The coupling between the circuit elements of the shield section number 1 are as follows: that substrate portion 540g is the substrate within the digital circuit 115, and the electrical noise thereon is in a sense the input to the guard strip 125. The substrate within shield section number 1 is modeled as three different electrical nodes, that is: 1) the substrate portion 540g for the portion of the substrate closest to the digital circuit; 2) the substrate portion 540f for the portion of the substrate around the middle of the shield section; and 3) the substrate portion 540e for the component of the substrate noise input to the shield section number 2, which is also the output of the shield section number 1. Across the shield section number 1, the substrate under n-well has resistance $R_{s1}$ which is proportional to the width $W_{nw1}$, which is modeled as being half located between substrate portions 540g and 540f and half between substrate portions 540f and 540e. The n-type well 245 is modeled as a MOSFET with its gate connected to $V_{ss}$ pads 160a and 160b (which are shown in FIG. 1 as an electrical node 160). $R_{pt}$ is the equivalent parallel resistors between the output node of shield section 1, i.e., 540e, and the $V_{ss}$ pads of shield section 1, i.e., 160a and 160b. The value of $R_{p1}$ is inversely proportional to the number of contacts and area of the p-tap region. Resistance inductance 161 models the two bonding wires that connect $V_{ss}$ pads 160a and 160b respectively, to the ground pins on the packaged IC. $C_{j1}$ is the junction capacitance between the n-type well 245 and the p-type substrate underneath n-type well 245. Resistor 520c is similar to resistor 420, and may have a value on the order of 1 kΩ. Resistor 520c couples the analog Vdd 410 to the n-type well 245.

Each shield section has a similar electrical model to that described with respect to the shield section number 1.

Connecting, via external series resistors 520a, 520b, and 520c, the $V_{dd}$ power supply 410 within the analog circuit 120 to n-type wells 210, 230, and 245 widens the depletion region between the n-type wells and the p-type substrate underneath them, thus reducing the junction capacitance. The external series resistors 520a, 520b, and 520c further reduce substrate noise coupling to analog $V_{dd}$ power supply 410.

Each one of resistance inductance 151, 156, and 161 models the two bonding wires that connect $V_{ss}$ pads 150a and 150b, or 155a and 155b, or 160a and 160b, respectively, to pins on the packaged IC.

$C_{j1}$, $C_{j2}$ and $C_{j3}$ are reversed biased junction capacitors between each one of the n-type wells 245, 230, or 210, respectively, and the substrate portions 540b, 540d, and 540f, respectively. $R_{s1}$, $R_{s2}$ and $R_{s3}$ are the series substrate resistors of each shield section. The values of these resistors are proportional to the width ($W_{nw}$) of the n-type well. $R_{p1}$, $R_{p2}$ and $R_{p3}$ are the equivalent parallel resistors between each shield section's output substrate portion, that is, 540e, 540c, or 540a respectively, and each shield section's $V_{ss}$ pads 160a and 160b, or 155a and 155b, or 150a and 150b. The values of $R_p$'s are inversely proportional to the number of contacts in, and the area of, the p-tap regions.

For minimum noise coupling $R_s$'s should be very high and $R_p$'s should very low. This can be achieved by larger n-type wells and larger p-tap regions, which in turn increases the area of the shield. Shield section number 1 is closest to the digital circuit 115 and is exposed to the maximum substrate noise. Shield section number 3 is closest to the analog circuit 120. The output of shield section number 3, that is, substrate portion 540a, represents the substrate noise injected from the digital circuit 115 to the analog circuit 120.

In order to reduce noise injection with a smaller shield area, the n-type well in shield section number 1 should be wider than the n-type well of shield section number 2, which should be wider than the n-type well of shield section number 3. For the same reasons, the p-tap region for of shield section number 3 should be wider than the p-tap region of shield section number 2, which should be wider than the p-tap region in shield section number 1.

As known by one of ordinary skill in the art, the present invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, and/or schematic capture levels. Examples of HDLs include, but are not limited to: GDS II and OASIS (layout level); various SPICE languages, and IBIS (circuit netlist level); and Virtuoso custom design language and Design Architecture-IC custom design language (schematic capture level). HDL descriptions may also be used for a variety of purposes, including but not limited to layout, behavior, logic and circuit design verification, modeling, and/or simulation.

The present invention is described in such a way that it can be easily integrated in the design flow by those skilled in the art.

The present invention includes various embodiments of integrated circuits (ICs) having a guard strip, as described herein. In modern CMOS technologies, it is difficult to implement both a digital circuit and an analog circuit in the same IC without electrical noise from the digital circuit compromising the operation of the analog circuit.

In contrast, various embodiments of the present invention may be used to reduce electronic noise transfer via the substrate of the IC from a digital circuit to an analog circuit implemented within the same IC.

A variety of specific qualities, quantities, and sizes have been specified herein. These include, but are not limited to: using a p-type substrate; and using a guard strip of 180 µm in width. It will be clear to one skilled in the art that these and other qualities, quantities, and sizes can be varied widely without departing from the objective and scope of the present invention.

Although the present invention has been described in terms of specific embodiments, it is anticipated that alterations and modifications thereof will no doubt become apparent to those skilled in the art. It is therefore intended that the following claims be interpreted as covering all such alterations and modification as falling within the true spirit and scope of the invention.

What is claimed is:

1. An integrated circuit (IC) comprising:
a central area of the IC that is partitioned into a first section containing at least one digital circuit and a second section containing at least one analog circuit;
a guard strip that is within the central area and that is positioned between the digital circuit and the analog circuit,
where the guard strip includes at least one shield section, where each particular shield section includes an n-type well and a p-tap, and where the position, within the particular shield section, of the n-type well is closer to the digital circuit than is the position, within the particular shield section, of the p-tap,
further where the guard strip includes N shield sections, N being two or more;
the shield sections are numbered from 1 to N, with shield section number 1 being the shield section that is closest to the digital circuit, shield section number 2 being next closest to the digital circuit, and so on through shield section number N which is the shield section that is closest to the analog circuit; and
the n-type well in the shield section number 1 is wider than the n-well in the shield section number 2, and so on through the shield section number N which has the narrowest n-well among all of the shield sections.

2. The IC of claim 1 where:
the guard strip includes N shield sections, N being two or more;
the shield sections are numbered from 1 to N, with shield section number 1 being the shield section that is closest to the digital circuit, shield section number 2 being next closest to the digital circuit, and so on through shield section number N which is the shield section that is closest to the analog circuit; and
the p-tap in the shield section number N is wider than the p-tap in the shield section number N−1, and so on through the shield section number 1 which has the narrowest p-tap among all of the shield sections.

3. A computer readable medium that includes a description of an IC, where the IC comprises:
a central area of the IC that is partitioned into a first section containing at least one digital circuit and a second section containing at least one analog circuit;
a guard strip that is within the central area and that is positioned within between the digital circuit and the analog circuit,
where the guard strip includes at least one shield section, where each particular shield section includes an n-type well and a p-tap, and where the position, within the particular shield section, of the n-type well is closer to the digital circuit than is the position, within the particular shield section, of the p-tap,
further where the guard strip includes N shield sections, N being two or more;
the shield sections are numbered from 1 to N, with shield section number 1 being the shield section that is closest to the digital circuit, shield section number 2 being next closest to the digital circuit, and so on through shield section number N which is the shield section that is closest to the analog circuit; and
the n-type well in the shield section number 1 is wider than the n-well in the shield section number 2, and so on through the shield section number N which has the narrowest n-well among all of the shield sections.

4. The computer readable medium of claim 3 where:
the guard strip includes N shield sections, N being two or more;
the shield sections are numbered from 1 to N, with shield section number 1 being the shield section that is closest to the digital circuit, shield section number 2 being next closest to the digital circuit, and so on through shield section number N which is the shield section that is closest to the analog circuit; and
the p-tap in the shield section number N is wider than the p-tap in the shield section number N−1, and so on through the shield section number 1 which has the narrowest p-tap among all of the shield sections.

5. An integrated circuit (IC) comprising:
digital circuit means located within a central area of the IC;
analog circuit means located within the central area; and guard strip means that is within the central area and that is positioned between the digital circuit means and the analog circuit means, where the guard strip includes at least one shield section, where each particular shield section includes an n-type well and a p-tap, and where the position, within the particular shield section, of the n-type well is closer to the digital circuit than is the position, within the particular shield section, of the p-tap, further where the guard strip includes N shield sections, N being two or more;

the shield sections are numbered from 1 to N, with shield section number 1 being the shield section that is closest to the digital circuit, shield section number 2 being next closest to the digital circuit, and so on through shield section number N which is the shield section that is closest to the analog circuit; and the n-type well in the shield section number 1 is wider than the n-well in the shield section number 2, and so on through the shield section number N which has the narrowest n-well among all of the shield sections.

* * * * *